(12) United States Patent
Jeong

(10) Patent No.: US 12,148,492 B2
(45) Date of Patent: Nov. 19, 2024

(54) SEMICONDUCTOR DEVICE AND SEMICONDUCTOR SYSTEM FOR DETECTING AN ERROR OCCURRED IN A PARITY

(71) Applicant: SK hynix Inc., Icheon-si (KR)

(72) Inventor: Yeong Han Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 195 days.

(21) Appl. No.: 17/941,773

(22) Filed: Sep. 9, 2022

(65) Prior Publication Data

US 2023/0282300 A1 Sep. 7, 2023

(30) Foreign Application Priority Data

Mar. 4, 2022 (KR) ........................ 10-2022-0028391

(51) Int. Cl.
*G11C 16/06* (2006.01)
*G11C 29/18* (2006.01)
*G11C 29/42* (2006.01)
*G11C 29/44* (2006.01)

(52) U.S. Cl.
CPC .............. *G11C 29/42* (2013.01); *G11C 29/18* (2013.01); *G11C 29/44* (2013.01)

(58) Field of Classification Search
CPC ...................................................... G11C 29/42

USPC .................................................... 365/185.09
See application file for complete search history.

(56) References Cited

U.S. PATENT DOCUMENTS 7,257,763 B1 * 8/2007 Srinivasan .......... G06F 11/1064
714/764
7,385,863 B2 6/2008 Nishihara et al.

FOREIGN PATENT DOCUMENTS

KR 1020190068101 A 6/2019

* cited by examiner

*Primary Examiner* — Hoai V Ho
(74) *Attorney, Agent, or Firm* — WILLIAM PARK & ASSOCIATES LTD.

(57) ABSTRACT

A semiconductor system includes a controller configured to output parity information that includes an expected value at which an error correction code (ECC) encoding operation has been performed on an address in a test mode of a semiconductor device and configured to receive failure information. The semiconductor system also includes the semiconductor device configured to store an internal parity generated by performing the ECC encoding operation on the address that is input in a normal mode of the semiconductor device and configured to output the failure information generated by comparing the parity information and an output parity generated from the internal parity that is stored in the semiconductor device in the test mode.

19 Claims, 12 Drawing Sheets

FIG. 7

| IP<1:6> | OP<1:6> | PIF<1:6> | ERROR CASE |
|---|---|---|---|
| LLLLLL | LLLLLL | LLLLLL | NO ERROR |
| LLLLLH | LL④LLH | LLLLLH | ERROR OCCURRED (OP<3>: L -> H) |
| LLLLHL | LLLLHL | LLLLHL | NO ERROR |
| . . . | . . . | . . . | . . . |
| ④HHHHL | LHHHHL | HHHHHL | ERROR OCCURRED (IP<1>: H -> L) |
| HHHHHH | HHHHHH | HHHHHH | NO ERROR |

SEMICONDUCTOR DEVICE AND SEMICONDUCTOR SYSTEM FOR DETECTING AN ERROR OCCURRED IN A PARITY

CROSS-REFERENCE TO RELATED APPLICATION

The present application claims priority under 35 U.S.C. § 119(a) to Korean application number 10-2022-0028391, filed in the Korean Intellectual Property Office on Mar. 4, 2022, the entire disclosure of which is incorporated herein by reference.

BACKGROUND

The present disclosure relates to a semiconductor device and semiconductor system capable of detecting an error of a parity that is stored in a fuse circuit.

Recently, in order to increase the operating speed of a semiconductor device, methods of inputting and outputting data including multiple bits every clock cycle, such as DDR2, DDR3, DDR4, and DDR5, are being used. If the input/output speed of data is increased, a separate device and method for guaranteeing the reliability of data transmission are additionally required because the probability that an error may occur during a process of transmitting the data is also increased.

There is a method of guaranteeing the reliability of data transmission by generating an error check code capable of checking whether an error has occurred every data transmission and transmitting the error check code along with the data. The error check code includes an error detection code (EDC) capable of detecting errors and an error correction code (ECC) capable of autonomously correcting errors when they occur.

SUMMARY

In an embodiment, a semiconductor system may include a controller configured to output parity information including an expected value at which an ECC encoding operation has been performed on an address in a test mode of a semiconductor device and configured to receive failure information. The semiconductor system may also include the semiconductor device configured to store an internal parity generated by performing the ECC encoding operation on the address that is input in a normal mode of the semiconductor device and configured to output the failure information generated by comparing the parity information and an output parity generated from the internal parity that is stored in the semiconductor device in the test mode.

In another embodiment, a semiconductor system may include a controller configured to output a command and an address, input and output data, output parity information including an expected value at which an ECC encoding operation has been performed on the address in a test mode, and receive failure information. The semiconductor system may also include a semiconductor device configured to output, as the failure information, a repair flag signal generated by comparing the address and a repaired repair address in a normal mode based on the command and the address, configured to store an internal parity generated by performing the ECC encoding operation on the address when an error occurs in internal data output by the address, and configured to output, as the failure information, a comparison signal generated by comparing the parity information and an output parity generated from the internal parity in the test mode.

In still another embodiment, a semiconductor device may include an error correction circuit configured to generate a failure detection signal when an error occurs in internal data in a normal mode, configured to generate an internal parity by performing an ECC encoding operation on an address, and configured to generate a repair flag signal by comparing the address and a repair address that is generated by correcting an error included in a failure address. The semiconductor device may also include a parity storage circuit configured to store the internal parity in the normal mode, configured to output, as an output parity, the internal parity that is stored in the parity storage circuit, and configured to output, as the output parity, the internal parity that is stored in the parity storage circuit in a test mode. The semiconductor device may further include a comparison circuit configured to generate a comparison signal by comparing the output parity and parity information that includes an expected value at which the ECC encoding operation has been performed on the address in the test mode.

BRIEF DESCRIPTION OF THE DRAWINGS

FIG. 7 is a table for describing an error occurring in a parity in the semiconductor system according to an embodiment of the present disclosure.

DETAILED DESCRIPTION

Figure 1:
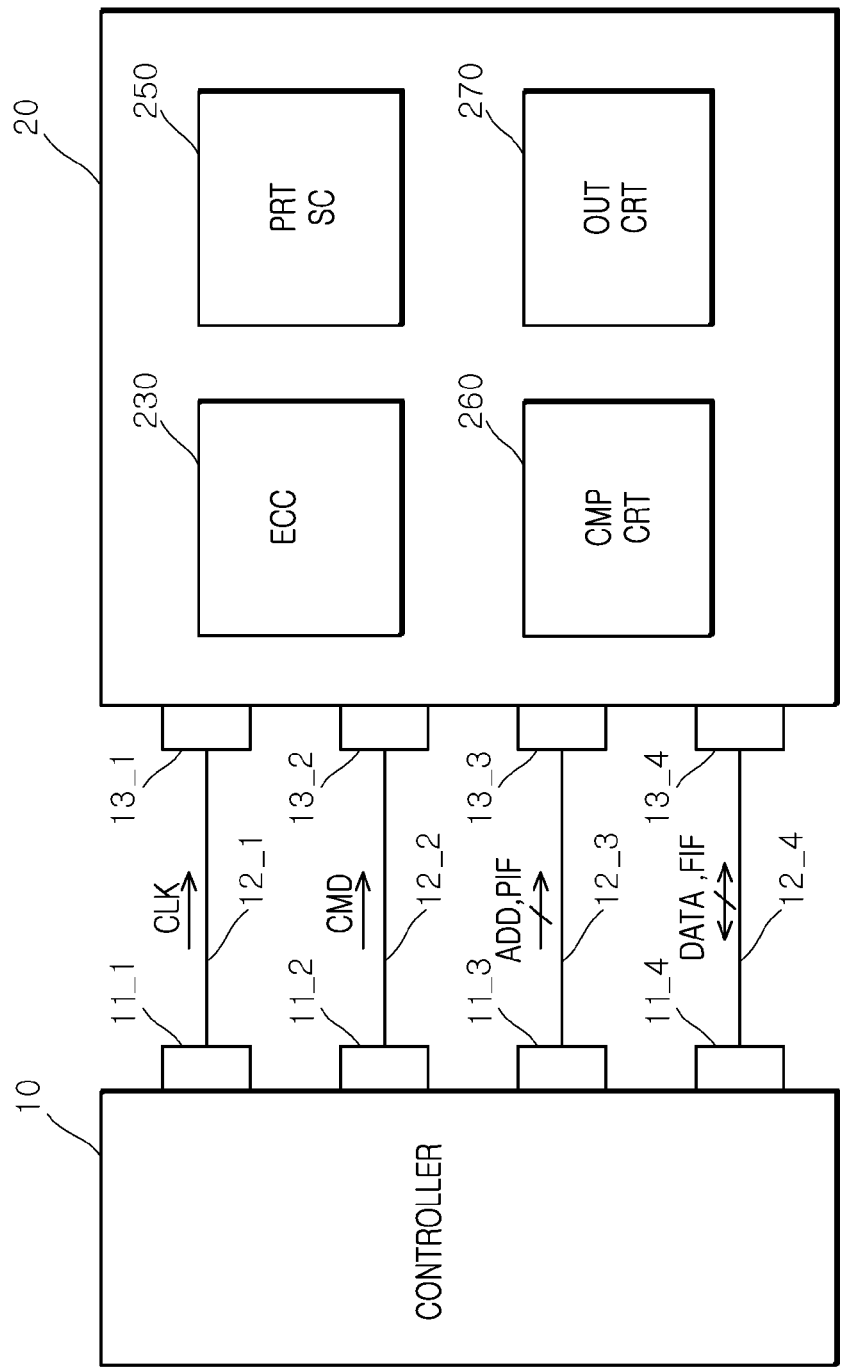
FIG. 1 is a block diagram illustrating a configuration of a semiconductor system according to an embodiment of the present disclosure.

In the descriptions of the following embodiments, the term "preset" indicates that the numerical value of a parameter is determined prior to the parameter being used in a process or algorithm. The numerical value of the parameter may be set before or when the process or algorithm is started or while the process or algorithm is being performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having "logic high level" is distinguished from a signal having "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the teachings of the present disclosure will be described in more detail through embodiments. The embodiments are only used to exemplify the teachings of the present disclosure, and the scope of the present disclosure is not limited by the embodiments.

The present disclosure provides a semiconductor device and a semiconductor system, which detect an error that has occurred in a parity by storing, in a fuse circuit, the parity generated by ECC-encoding an address and detecting a result of a comparison between an expected value including error information with regard to the address and the parity that is stored in the fuse circuit in a test mode.

Furthermore, the present disclosure provides a semiconductor device and a semiconductor system, which detect whether a repair has been performed on an address by storing, in a fuse circuit, the address at a location at which an error occurred and detecting a result of a comparison between an input address and a repair address that is generated by repairing the address stored in the fuse circuit in a normal mode.

According to the present disclosure, there is an effect in that an error that has occurred in a parity can be detected by storing, in a fuse circuit, the parity generated by ECC-encoding an address and detecting a result of a comparison between an expected value including error information with regard to the address and the parity that is stored in the fuse circuit in the test mode.

Furthermore, according to the present disclosure, there is an effect in that whether a repair has been performed on an address can be detected by storing, in a fuse circuit, an address at a location at which an error occurred and detecting a result of a comparison between an input address and a repair address that is generated by repairing the address stored in the fuse circuit in the normal mode.

As illustrated in FIG. 1, a semiconductor system 1 according to an embodiment of the present disclosure may include a controller 10 and a semiconductor device 20.

The controller 10 may include a first control pin 11_1, a second control pin 11_2, a third control pin 11_3, and a fourth control pin 11_4. The semiconductor device 20 may include a first device pin 13_1, a second device pin 13_2, a third device pin 13_3, and a fourth device pin 13_4.

The controller 10 may transmit a clock CLK to the semiconductor device 20 through a first transmission line 12_1 that is coupled between the first control pin 11_1 and the first device pin 13_1. The clock CLK may be set as a signal that is periodically toggled in order to synchronize operations of the controller 10 and the semiconductor device 20.

The controller 10 may transmit a command CMD to the semiconductor device 20 through a second transmission line 12_2 that is coupled between the second control pin 11_2 and the second device pin 13_2. Each of the second control pin 11_2, the second transmission line 12_2, and the second device pin 13_2 may be implemented in plural based on the number of bits of the command CMD.

The controller 10 may transmit an address ADD and parity information PIF to the semiconductor device 20 through a third transmission line 12_3 that is coupled between the third control pin 11_3 and the third device pin 13_3. Each of the third control pin 11_3, the third transmission line 12_3, and the third device pin 13_3 may be implemented in plural based on the number of bits of the address ADD and the parity information PIF.

The controller 10 may transmit data DATA to the semiconductor device 20 through a fourth transmission line 12_4 that is coupled between the fourth control pin 11_4 and the fourth device pin 13_4 or may receive data DATA from the semiconductor device 20. The controller 10 may receive failure information FIF from the semiconductor device 20 through a fourth transmission line 12_4 that is coupled between the fourth control pin 11_4 and the fourth device pin 13_4. Each of the fourth control pin 13_4, the fourth transmission line 12_4, and the fourth device pin 13_4 may be implemented in plural based on the number of bits of the data DATA and the failure information FIF.

The controller 10 may output the clock CLK, the command CMD, and the address ADD for controlling a normal mode of the semiconductor device 20. The controller 10 may output the data DATA to the semiconductor device 20 in a write operation in the normal mode. The controller 10 may receive the data DATA from the semiconductor device 20 in a read operation in the normal mode. The controller 10 may detect whether a repair has been performed on the address ADD by receiving the failure information FIF from the semiconductor device 20 in the write operation and the read operation. The controller 10 may output the parity information PIF including error occurrence information with regard to the address ADD in a test mode. The controller 10 may detect whether an error has occurred in internal parities (IP<1:M> in FIG. 2) and output parities (OP<1:M> in FIG. 2) by receiving the failure information FIF in the test mode. The parity information PIF may be set as an expected value at which an ECC encoding operation has been performed on the address ADD.

The semiconductor device 20 may include an error correction circuit (ECC) 230, a parity storage circuit (PRT SC) 250, a comparison circuit (CMP CRT) 260, and an output circuit (OUT CRT) 270.

The error correction circuit 230 may generate the internal parities (IP<1:M> in FIG. 2) by performing an ECC encoding operation on the address ADD when an error occurs in internal data (ID in FIG. 2) output by the address ADD in the normal mode.

Figure 2:
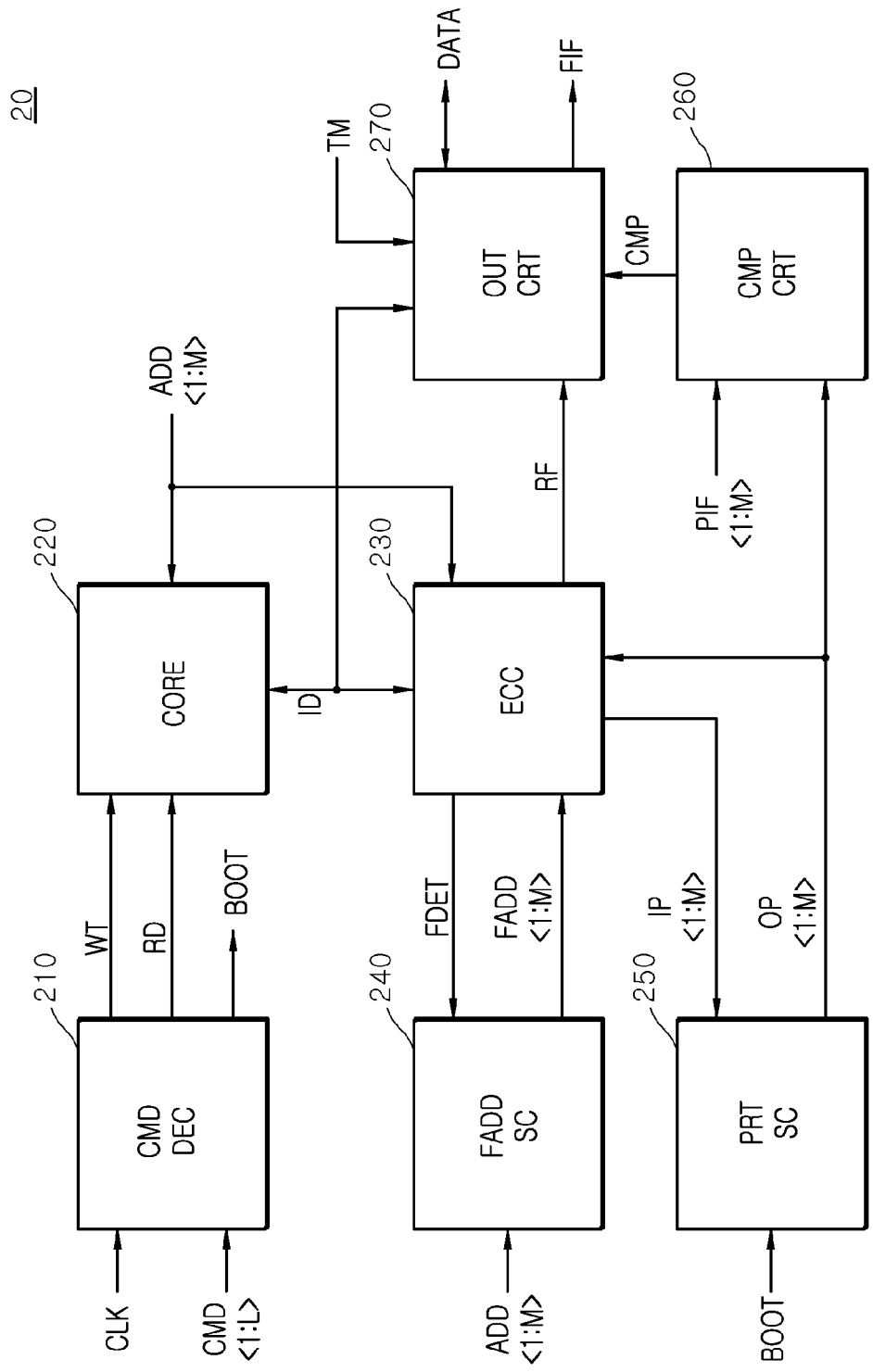
FIG. 2 is a block diagram illustrating a configuration according to an example of a semiconductor device included in the semiconductor system illustrated in FIG. 1.

The parity storage circuit 250 may be implemented as multiple fuse circuits. The parity storage circuit 250 may store the internal parities (IP<1:M> in FIG. 2) in the normal mode. The parity storage circuit 250 may output the internal parities (IP<1:M> in FIG. 2) stored therein as the output parities (OP<1:M> in FIG. 2) in the normal mode. The parity storage circuit 250 may output the internal parities (IP<1:

M> in FIG. 2) stored therein as the output parities (OP<1: M> in FIG. 2) in the test mode.

The comparison circuit 260 may generate a comparison signal (CMP in FIG. 2) by comparing the output parities (OP<1:M> in FIG. 2) and the parity information PIF in the test mode. The comparison circuit 260 may generate the comparison signal (CMP in FIG. 2) enabled when the output parities (OP<1:M> in FIG. 2) and the parity information PIF have different logic level combinations in the test mode.

The output circuit 270 may output the comparison signal (CMP in FIG. 2) as the failure information FIF in the test mode.

FIG. 2 is a block diagram illustrating a configuration according to an example of the semiconductor device 20 included in the semiconductor system 1 illustrated in FIG. 1. The semiconductor device 20 may include a command decoder (CMD DEC) 210, a core circuit (CORE) 220, the error correction circuit (ECC) 230, a failure address storage circuit (FADD SC) 240, the parity storage circuit (PRT SC) 250, the comparison circuit (CMP CRT) 260, and the output circuit (OUT CRT) 270.

The command decoder 210 may generate a write signal WT, a read signal RD, and a bootup signal BOOT by decoding first to L-th commands CMD<1:L> in synchronization with the clock CLK. The command decoder 210 may generate the write signal WT that is enabled when the first to L-th commands CMD<1:L> that are input in synchronization with the clock CLK have a logic level combination for a write operation. The command decoder 210 may generate the read signal RD that is enabled when the first to L-th commands CMD<1:L> that are input in synchronization with the clock CLK have a logic level combination for a read operation. The command decoder 210 may generate the bootup signal BOOT that is enabled when the first to L-th commands CMD<1:L> that are input in synchronization with the clock CLK have a logic level combination for a bootup operation. The write operation may be set as an operation for storing, in the core circuit 220, the data DATA that is input from the controller 10. The read operation may be set as an operation for generating the data DATA from the internal data ID stored in the core circuit 220 and outputting the data DATA to the controller 10. The bootup operation may be set as an operation for outputting information programmed into a fuse circuit (e.g., the parity storage circuit 250) included in the semiconductor device 20. The information that is output in the bootup operation may include information that sets a condition under which the semiconductor device 20 operates. For example, the information that is output in the bootup operation may include a variety of types of information, such as the amount of delay by which the first to M-th output parities OP<1:M> and data are input and output. Here, "L" and "M" represent integers greater than one (1).

The core circuit 220 may store the internal data ID at a location that is selected by first to M-th addresses ADD<1: M> when the write signal WT for performing a write operation in the normal mode is input. The core circuit 220 may output the internal data ID stored at a location selected by the first to M-th addresses ADD<1:M> when the read signal RD for performing a read operation in the normal mode is input. The core circuit 220 may be implemented as a common memory circuit including multiple memory cells.

The error correction circuit 230 may correct an error that is included in the internal data ID after the start of a write operation in the normal mode. The error correction circuit 230 may correct an error that is included in the internal data ID after the start of a read operation in the normal mode. The error correction circuit 230 may generate a failure detection signal FDET when an error is included in the internal data ID that is output by the core circuit 220, after the start of a read operation in the normal mode. The error correction circuit 230 may generate the first to M-th internal parities IP<1:M> by performing an ECC encoding operation on the first to M-th addresses ADD<1:M> when an error is included in the internal data ID that is output by the core circuit 220, after the start of a read operation in the normal mode. After the start of a read operation in the normal mode, the error correction circuit 230 may correct an error that is included in first to M-th failure addresses FADD<1:M> based on the first to M-th internal parities IP<1:M> and the first to M-th output parities OP<1:M> by performing an ECC encoding operation and an ECC decoding operation, and may generate a repair flag signal RF by comparing the first to M-th addresses ADD<1:M> and first to M-th repair addresses (RADD<1:M> in FIG. 3) an error of which has been corrected. The error correction circuit 230 may generate the first to M-th internal parities IP<1:M> by performing an ECC encoding operation on the first to M-th addresses ADD<1:M> through an error correction code (ECC). The error correction circuit 230 may perform a repair operation for correcting an error that is included in the first to M-th failure addresses FADD<1:M> by performing an ECC encoding operation and an ECC decoding operation on the first to M-th failure addresses FADD<1:M> through an error correction code (ECC). The error correction circuit 230 may be implemented as a common error correction circuit which performs an ECC encoding operation and an ECC decoding operation.

The failure address storage circuit 240 may be implemented as a fuse circuit that includes multiple fuses. The failure address storage circuit 240 may store the first to M-th addresses ADD<1:M> when the failure detection signal FDET is input. The failure address storage circuit 240 may have its multiple fuses programmed when the failure detection signal FDET is input, and may store the first to M-th addresses ADD<1:M> in the multiple fuses. The failure address storage circuit 240 may output, as the first to M-th failure addresses FADD<1:M>, the first to M-th addresses ADD<1:M> stored therein after the start of a read operation in the normal mode. An operation of multiple fuses being programmed in the failure address storage circuit 240 may be set as an operation of rupturing multiple fuses.

The parity storage circuit 250 may be implemented as a fuse circuit that includes multiple fuses. The parity storage circuit 250 may store the first to M-th internal parities IP<1:M> after the start of a read operation in the normal mode. The parity storage circuit 250 may output, as the first to M-th output parities OP<1:M>, the first to M-th internal parities IP<1:M> stored therein after the start of a read operation in the normal mode. The parity storage circuit 250 may have its multiple fuses programmed, and may store the first to M-th internal parities IP<1:M> in the multiple fuses. The parity storage circuit 250 may output, as the first to M-th output parities OP<1:M>, the first to M-th internal parities IP<1:M> stored therein when the bootup signal BOOT is input in the test mode.

The comparison circuit 260 may generate the comparison signal CMP by comparing the first to M-th output parities OP<1:M> and first to M-th parity information PIF<1:M> in the test mode. The comparison circuit 260 may generate the comparison signal CMP that is enabled when the first to M-th output parities OP<1:M> and the first to M-th parity information PIF<1:M> do not have the same logic level combination in the test mode. The comparison circuit 260 may generate the comparison signal CMP that is disabled when the first to M-th output parities OP<1:M> and the first to M-th parity information PIF<1:M> have the same logic level combination in the test mode.

The output circuit 270 may generate the internal data ID from the data DATA after the start of a write operation in the normal mode. The output circuit 270 may generate the internal data ID by buffering the data DATA after the start of a write operation in the normal mode. The output circuit 270 may generate the data DATA from the internal data ID after the start of a read operation in the normal mode. The output circuit 270 may generate the data DATA by buffering the internal data ID after the start of a read operation in the normal mode. The output circuit 270 may output any one of the repair flag signal RF and the comparison signal CMP as the failure information FIF based on a test mode signal TM. The output circuit 270 may output, as the failure information FIF, the repair flag signal RF when the test mode signal TM disabled after the start of a read operation in the normal mode is input. The output circuit 270 may output the comparison signal CMP as the failure information FIF when the test mode signal TM enabled in the test mode is input.

Figure 3:
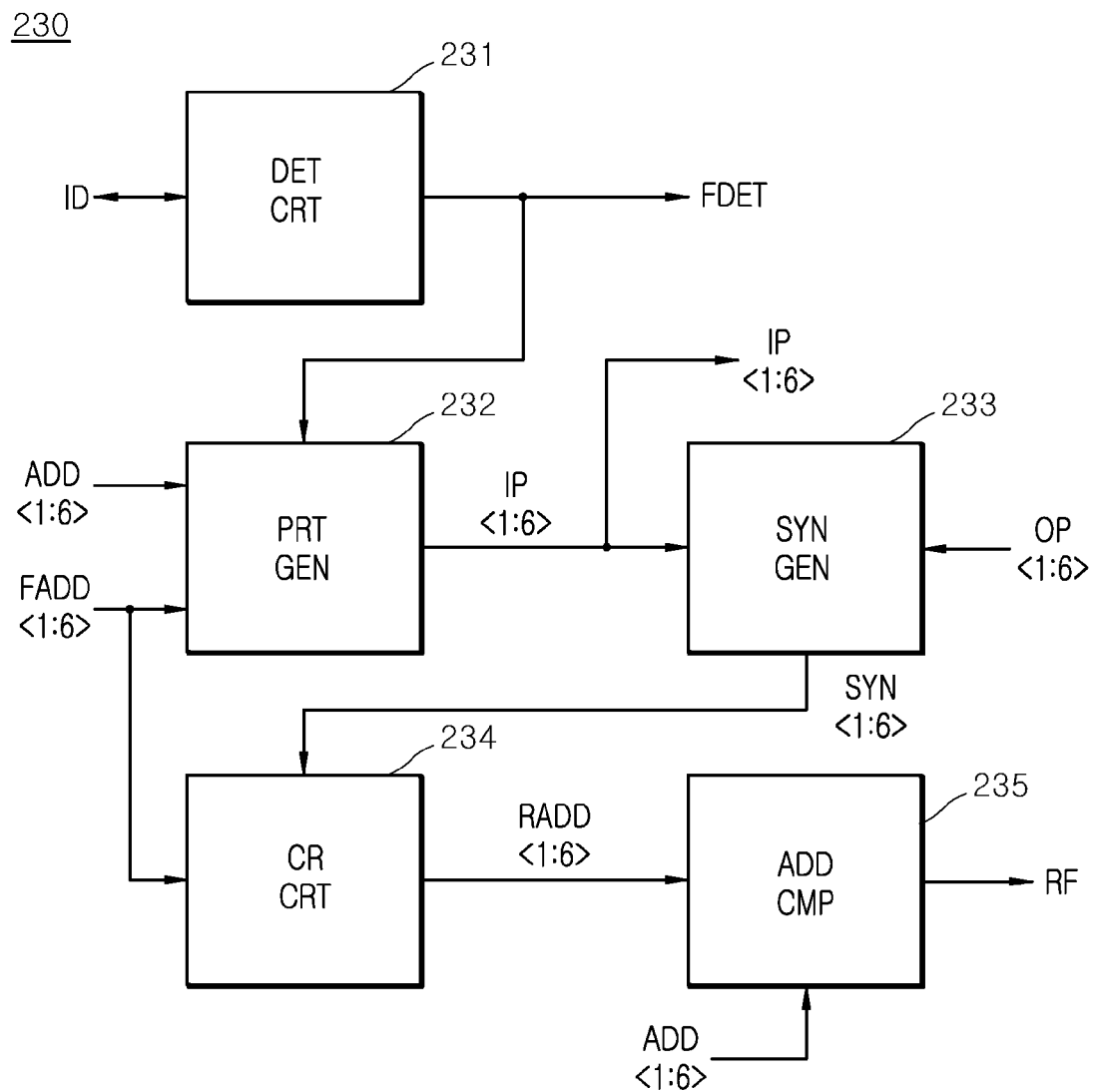
FIG. 3 is a block diagram illustrating a configuration according to an example of an error correction circuit included in the semiconductor device illustrated in FIG. 2.

FIG. 3 is a block diagram illustrating a configuration according to an example of the error correction circuit 230 included in the semiconductor device 20. In the illustrated example, "M" shown in FIG. 2 is taken to be six (6). However, "M" may represent any integer greater than one (1). The error correction circuit 230 may include a detection circuit (DET CRT) 231, a parity generation circuit (PRT GEN) 232, a syndrome generation circuit (SYN GEN) 233, a correction circuit (CR CRT) 234, and an address comparison circuit (ADD CMP) 235.

The detection circuit 231 may generate the failure detection signal FDET by detecting an error of the internal data ID. The detection circuit 231 may generate the failure detection signal FDET that is enabled when an error occurs in the internal data ID after the start of a read operation in the normal mode. The detection circuit 231 may correct an error of the internal data ID after the start of a write operation and read operation in the normal mode.

The parity generation circuit 232 may generate the first to sixth internal parities IP<1:6> by performing an ECC encoding operation on the first to sixth addresses ADD<1:6> when the failure detection signal FDET is enabled. The parity generation circuit 232 may generate the first to sixth internal parities IP<1:6> by performing an ECC encoding operation on the first to sixth failure addresses FADD<1:6> in the normal mode.

The syndrome generation circuit 233 may generate first to sixth syndromes SYN<1:6> by performing an ECC decoding operation on the first to sixth internal parities IP<1:6> and the first to sixth output parities OP<1:6>. The syndrome generation circuit 233 may generate the first to sixth syndromes SYN<1:6> by comparing the first to sixth internal parities IP<1:6> and the first to sixth output parities OP<1:6>.

The correction circuit 234 may generate first to sixth repair addresses RADD<1:6> by correcting an error included in the first to sixth failure addresses FADD<1:6> based on the first to sixth syndromes SYN<1:6>. The correction circuit 234 may generate the first to sixth repair addresses RADD<1:6> by inverting a bit in which an error has occurred among the first to sixth failure addresses FADD<1:6> based on the first to sixth syndromes SYN<1:6>. The correction circuit 234 may generate the first to sixth repair addresses RADD<1:6> by performing a repair operation of inverting a bit in which an error has occurred among the first to sixth failure addresses FADD<1:6> based on the first to sixth syndromes SYN<1:6>.

The address comparison circuit 235 may generate the repair flag signal RF by comparing the first to sixth repair addresses RADD<1:6> and the first to sixth addresses ADD<1:6>. The address comparison circuit 235 may generate the repair flag signal RF that is enabled when the first to sixth repair addresses RADD<1:6> and the first to sixth addresses ADD<1:6> do not have the same logic level combination. The address comparison circuit 235 may generate the repair flag signal RF that is disabled when the first to sixth repair addresses RADD<1:6> and the first to sixth addresses ADD<1:6> have the same logic level combination.

Each of the first to sixth addresses ADD<1:6>, the first to sixth failure addresses FADD<1:6>, the first to sixth internal parities IP<1:6>, the first to sixth syndromes SYN<1:6>, and the first to sixth repair addresses RADD<1:6> illustrated in FIG. 3 has been set as six bits, but may be set as various numbers of bits in different embodiments.

Figure 4:
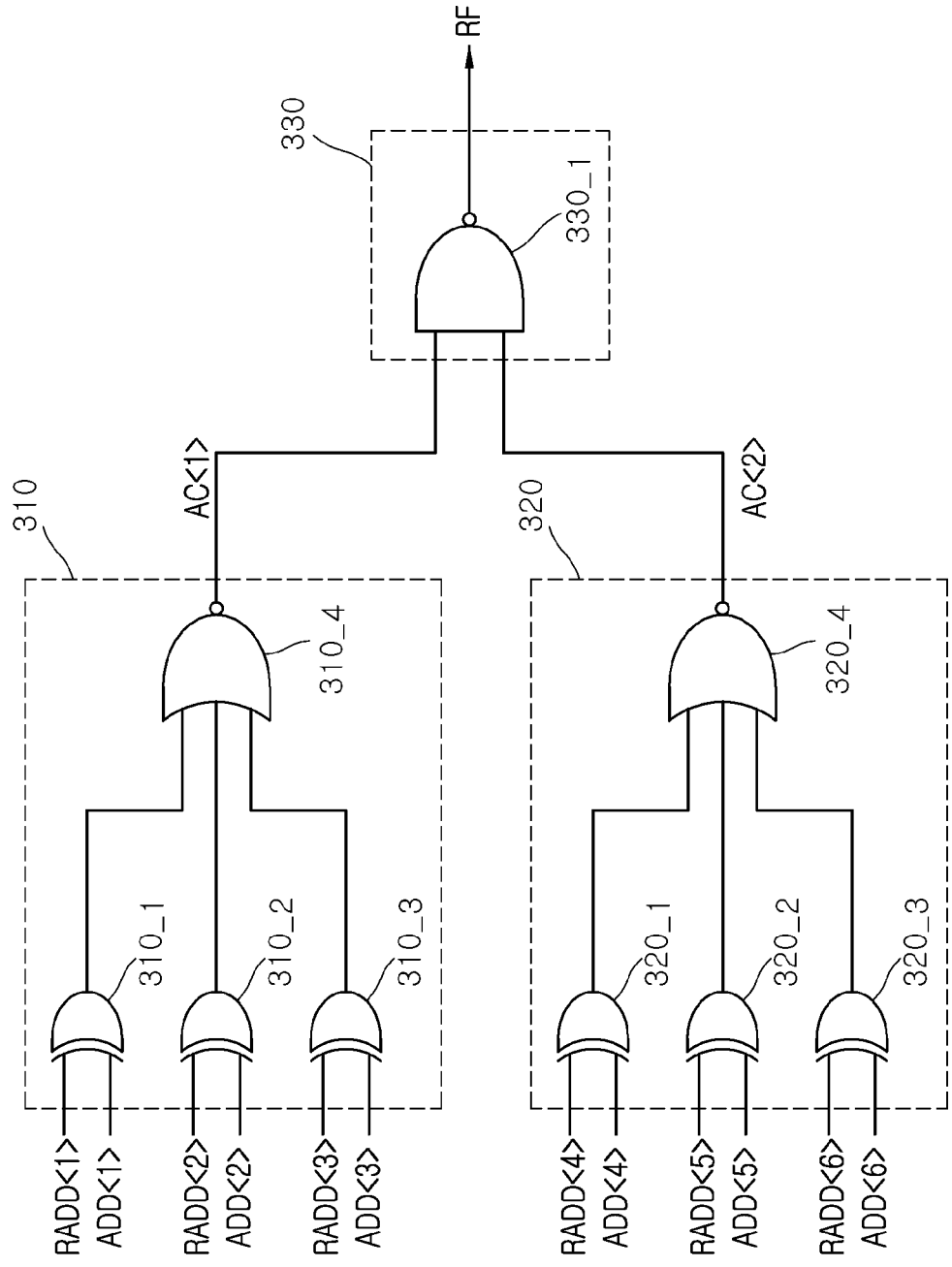
FIG. 4 is a circuit diagram illustrating a configuration according to an example of an address comparison circuit included in the error correction circuit illustrated in FIG. 3.

FIG. 4 is a circuit diagram illustrating a configuration according to an example of the address comparison circuit 235 included in the error correction circuit 230. The address comparison circuit 235 may include a first address comparison signal generation circuit 310, a second address comparison signal generation circuit 320, and a repair flag signal generation circuit 330.

The first address comparison signal generation circuit 310 may be implemented by using XOR gates 310_1, 310_2, and 310_3 and an NOR gate 310_4. The XOR gate 310_1 may generate an output signal having a logic high level when the first repair address RADD<1> and the first address ADD<1> have different logic levels. The XOR gate 310_1 may generate an output signal having a logic low level when the first repair address RADD<1> and the first address ADD<1> have the same logic level.

The XOR gate 310_2 may generate an output signal having the logic high level when the second repair address RADD<2> and the second address ADD<2> have different logic levels. The XOR gate 310_2 may generate an output signal having the logic low level when the second repair address RADD<2> and the second address ADD<2> have the same logic level.

The XOR gate 310_3 may generate an output signal having the logic high level when the third repair address RADD<3> and the third address ADD<3> have different logic levels. The XOR gate 310_3 may generate an output signal having the logic low level when the third repair address RADD<3> and the third address ADD<3> have the same logic level.

The NOR gate 310_4 may generate a first address comparison signal AC<1> having the logic low level when any one of the output signals of the XOR gates 310_1, 310_2, and 310_3 has the logic high level. The NOR gate 310_4 may generate the first address comparison signal AC<1> having the logic high level when all of the output signals of the XOR gates 310_1, 310_2, and 310_3 have the logic low levels.

The second address comparison signal generation circuit 320 may be implemented by using XOR gates 320_1, 320_2, and 320_3 and an NOR gate 320_4. The XOR gate 320_1 may generate an output signal having the logic high level when the fourth repair address RADD<4> and the fourth address ADD<4> have different logic levels. The XOR gate 320_1 may generate an output signal having the logic low level when the fourth repair address RADD<4> and the fourth address ADD<4> have the same logic level.

The XOR gate 320_2 may generate an output signal having the logic high level when the fifth repair address RADD<5> and the fifth address ADD<5> have different logic levels. The XOR gate 320_2 may generate an output signal having the logic low level when the fifth repair address RADD<5> and the fifth address ADD<5> have the same logic level.

The XOR gate 320_3 may generate an output signal having the logic high level when the sixth repair address RADD<6> and the sixth address ADD<6> have different logic levels. The XOR gate 320_3 may generate an output signal having the logic low level when the sixth repair address RADD<6> and the sixth address ADD<6> have the same logic level.

The NOR gate 320_4 may generate a second address comparison signal AC<2> having the logic low level when any one of the output signals of the XOR gates 320_1, 320_2, and 320_3 has the logic high level. The NOR gate 320_4 may generate the second address comparison signal AC<2> having the logic high level when all of the output signals of the XOR gates 320_1, 320_2, and 320_3 have the logic low levels.

The repair flag signal generation circuit 330 may be implemented by using a NAND gate 330_1. The repair flag signal generation circuit 330 may generate the repair flag signal RF having the logic high level when any one or both of the first address comparison signal AC<1> and the second address comparison signal AC<2> has the logic low level. The repair flag signal generation circuit 330 may generate the repair flag signal RF having the logic low level when both the first address comparison signal AC<1> and the second address comparison signal AC<2> have the logic high levels.

Figure 5:
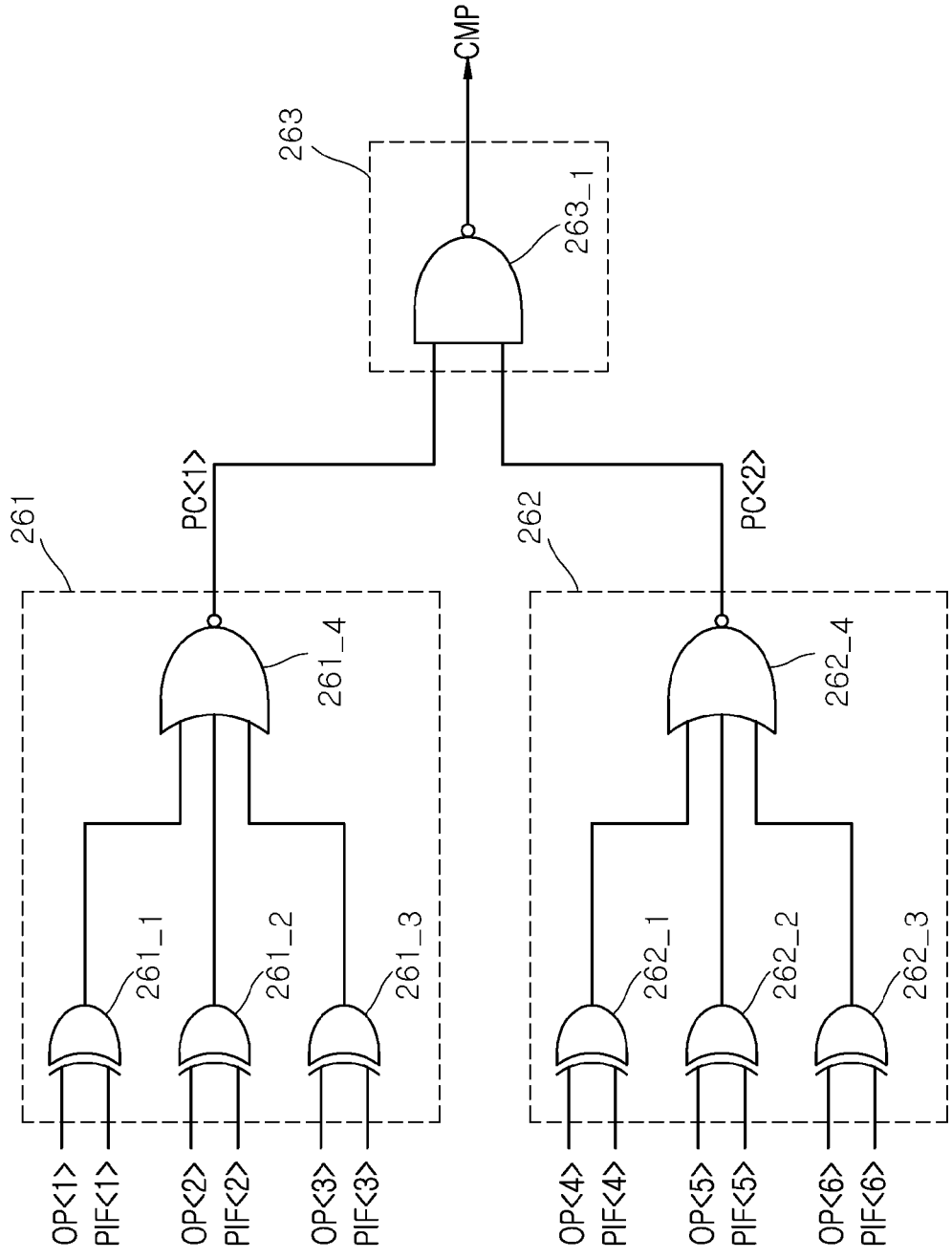
FIG. 5 is a circuit diagram illustrating a configuration according to an example of a comparison circuit included in the semiconductor device illustrated in FIG. 2.

FIG. 5 is a circuit diagram illustrating a configuration according to an example of the comparison circuit 260 included in the semiconductor device 20. The comparison circuit 260 may include a first parity comparison signal generation circuit 261, a second parity comparison signal generation circuit 262, and a comparison signal generation circuit 263.

The first parity comparison signal generation circuit 261 may be implemented by using XOR gates 261_1, 261_2, and 261_3 and an NOR gate 261_4. The XOR gate 261_1 may generate an output signal having the logic high level when the first output parity OP<1> and the first parity information PIF<1> have different logic levels. The XOR gate 261_1 may generate an output signal having the logic low level when the first output parity OP<1> and the first parity information PIF<1> have the same logic level.

The XOR gate 261_2 may generate an output signal having the logic high level when the second output parity OP<2> and the second parity information PIF<2> have different logic levels. The XOR gate 261_2 may generate an output signal having the logic low level when the second output parity OP<2> and the second parity information PIF<2> have the same logic level.

The XOR gate 261_3 may generate an output signal having the logic high level when the third output parity OP<3> and the third parity information PIF<3> have different logic levels. The XOR gate 261_3 may generate an output signal having the logic low level when the third output parity OP<3> and the third parity information PIF<3> have the same logic level.

The NOR gate 261_4 may generate a first parity comparison signal PC<1> having the logic low level when any one of the output signals of the XOR gates 261_1, 261_2, and 261_3 has the logic high level. The NOR gate 261_4 may generate the first parity comparison signal PC<1> having the logic high level when all of the output signals of the XOR gates 261_1, 261_2, and 261_3 have the logic low levels.

The second parity comparison signal generation circuit 262 may be implemented by using XOR gates 262_1, 262_2, and 262_3 and an NOR gate 262_4. The XOR gate 262_1 may generate an output signal having the logic high level when the fourth output parity OP<4> and the fourth parity information PIF<4> have different logic levels. The XOR gate 262_1 may generate an output signal having the logic low level when the fourth output parity OP<4> and the fourth parity information PIF<4> have the same logic level.

The XOR gate 262_2 may generate an output signal having the logic high level when the fifth output parity OP<5> and the fifth parity information PIF<5> have different logic levels. The XOR gate 262_2 may generate an output signal having the logic low level when the fifth output parity OP<5> and the fifth parity information PIF<5> have the same logic level.

The XOR gate 262_3 may generate an output signal having the logic high level when the sixth output parity OP<6> and the sixth parity information PIF<6> have different logic levels. The XOR gate 262_3 may generate an output signal having the logic low level when the sixth output parity OP<6> and the sixth parity information PIF<6> have the same logic level.

The NOR gate 262_4 may generate a second parity comparison signal PC<2> having the logic low level when any one of the output signals of the XOR gates 262_1, 262_2, and 262_3 has the logic high level. The NOR gate 262_4 may generate the second parity comparison signal PC<2> having the logic high level when all of the output signals of the XOR gates 262_1, 262_2, and 262_3 have the logic low levels.

The comparison signal generation circuit 263 may be implemented by using a NAND gate 263_1. The comparison signal generation circuit 263 may generate the comparison signal CMP having the logic high level when any one or both of the first parity comparison signal PC<1> and the second parity comparison signal PC<2> has the logic low level. The comparison signal generation circuit 263 may generate the comparison signal CMP having the logic low level when both the first parity comparison signal PC<1> and the second parity comparison signal PC<2> have the logic high level.

Figure 6:
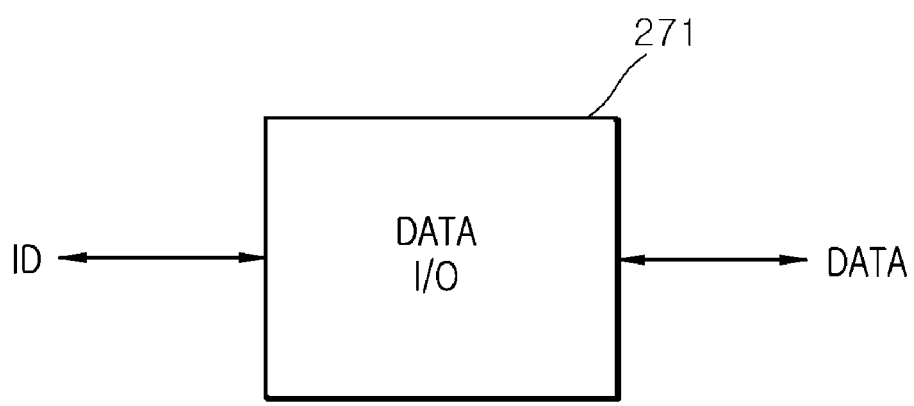
FIG. 6 is a block diagram illustrating a configuration according to an example of an output circuit included in the semiconductor device illustrated in FIG. 2.
Figure 6:
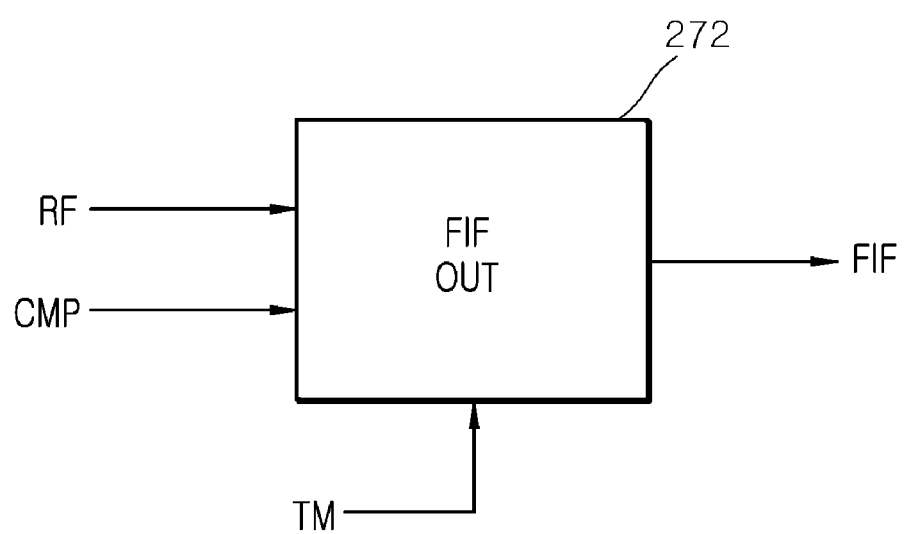

FIG. 6 is a block diagram illustrating a configuration according to an example of the output circuit 270 included in the semiconductor device 20. The output circuit 270 may include a data input/output circuit (DATA I/O) 271 and a failure information output circuit (FIF OUT) 272.

The data input/output circuit 271 may output the data DATA as the internal data ID after the start of a write operation in the normal mode. The data input/output circuit 271 may generate the internal data ID by buffering the data DATA after the start of a write operation in the normal mode. The data input/output circuit 271 may output the internal data ID as the data DATA after the start of a read operation in the normal mode. The data input/output circuit 271 may generate the data DATA by buffering the internal data ID after the start of a read operation in the normal mode.

The failure information output circuit 272 may output any one of the repair flag signal RF and the comparison signal CMP as the failure information FIF determined by the test mode signal TM. The failure information output circuit 272 may output the repair flag signal RF as the failure information FIF when the test mode signal TM is disabled in the normal mode. The failure information output circuit 272 may output the comparison signal CMP as the failure information FIF when the test mode signal TM is enabled in the test mode.

FIG. 7 is a table for describing an error occurring in a parity in the semiconductor system 1 according to an embodiment of the present disclosure.

First, if an error is not present in a parity (NO ERROR), when the first to sixth internal parities IP<1:6> are generated as "L, L, L, L, L, L", the first to sixth output parities OP<1:6> are generated as "L, L, L, L, L, L", and the first to sixth parity information PIF<1:6> are input as "L, L, L, L, L, L", the failure information FIF having the logic low level may be generated because the first to sixth output parities OP<1:6> and the first to sixth parity information PIF<1:6> have the same logic levels. The controller 10 may detect that an error is not present in the first to sixth internal parities IP<1:6> and the first to sixth output parities OP<1:6> by receiving the failure information FIF having the logic low level. A case where all of the first to sixth internal parities IP<1:6>, the first to sixth output parities OP<1:6>, and the first to sixth parity information PIF<1:6> have the same logic level combination means a case where an error is not present in a parity (NO ERROR).

Next, if an error occurs in the first to sixth output parities OP<1:6> (ERROR OCCURRED), when the first to sixth internal parities IP<1:6> are generated as "L, L, L, L, L, H", the first to sixth output parities OP<1:6> are generated as "L, L, H, L, L, H", and the first to sixth parity information PIF<1:6> are input as "L, L, L, L, L, H", the third output parity OP<3> having the logic low level L needs to be generated, but the third output parity OP<3> having the logic high level H may be generated. At this time, the failure information FIF having the logic high level may be generated because the first to sixth output parities <OP<1:6> and the first to sixth parity information PIF<1:6> are different from each other. The controller 10 may detect that an error is present in the first to sixth internal parities IP<1:6> and the first to sixth output parities OP<1:6> by receiving the failure information FIF having the logic high level.

Next, if an error occurs in the first to sixth internal parities IP<1:6> (ERROR OCCURRED), when the first to sixth internal parities IP<1:6> are generated as "L, H, H, H, H, L", the first to sixth output parities OP<1:6> are generated as "L, H, H, H, H, L", and the first to sixth parity information PIF<1:6> are input as "H, H, H, H, H, L", the first internal parity IP<1> having the logic high level H needs to be generated, but the first internal parity IP<1> having the logic low level L may be generated. At this time, the failure information FIF having the logic high level may be generated because the first to sixth output parities <OP<1:6> and the first to sixth parity information PIF<1:6> are different from each other. The controller may detect that an error is present in the first to sixth internal parities IP<1:6> and the first to sixth output parities OP<1:6> by receiving the failure information FIF having the logic high level.

Figure 8:
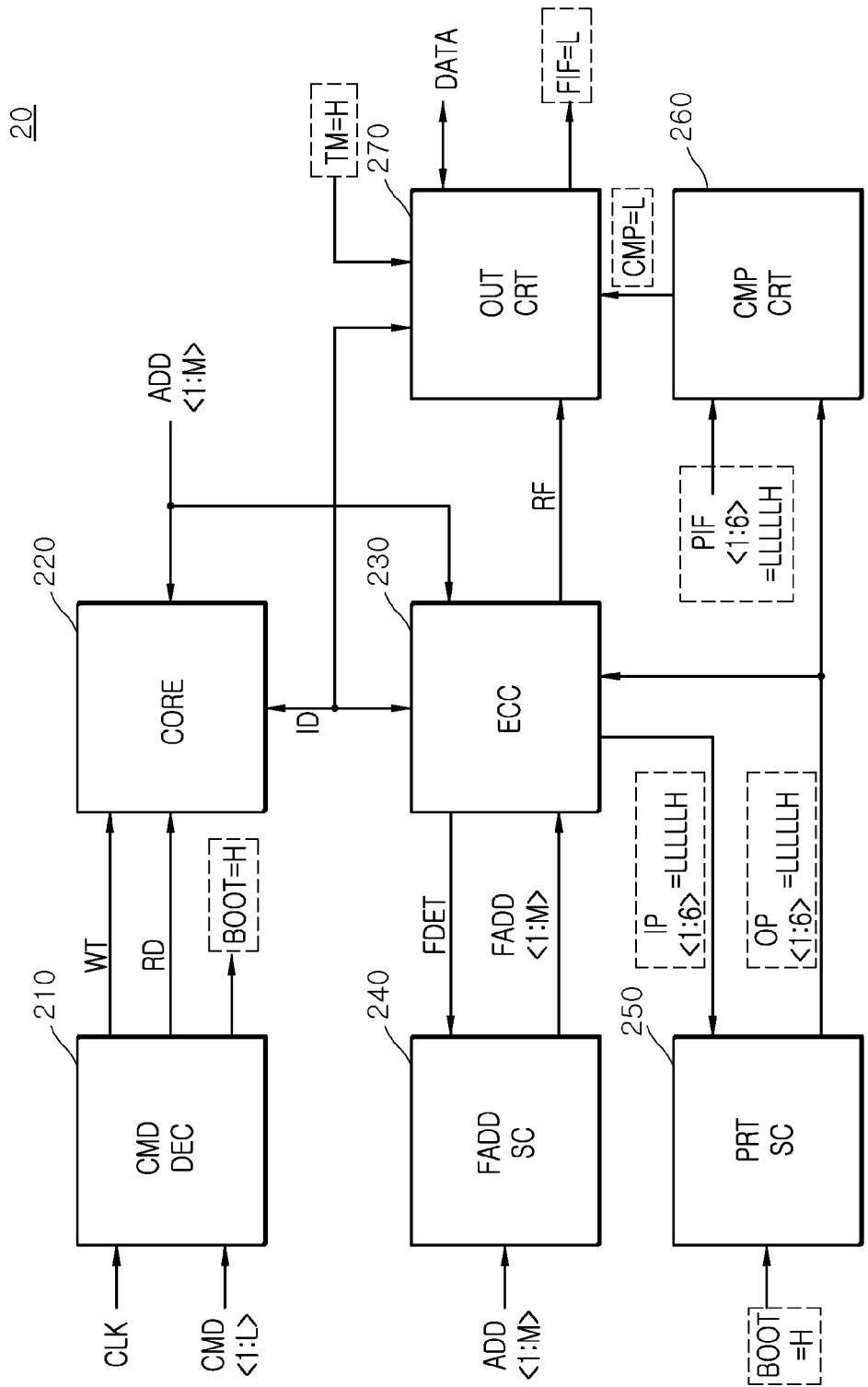
FIGS. 8 to 11 are diagrams for describing an operation of the semiconductor device according to an example of the present disclosure.
Figure 9:
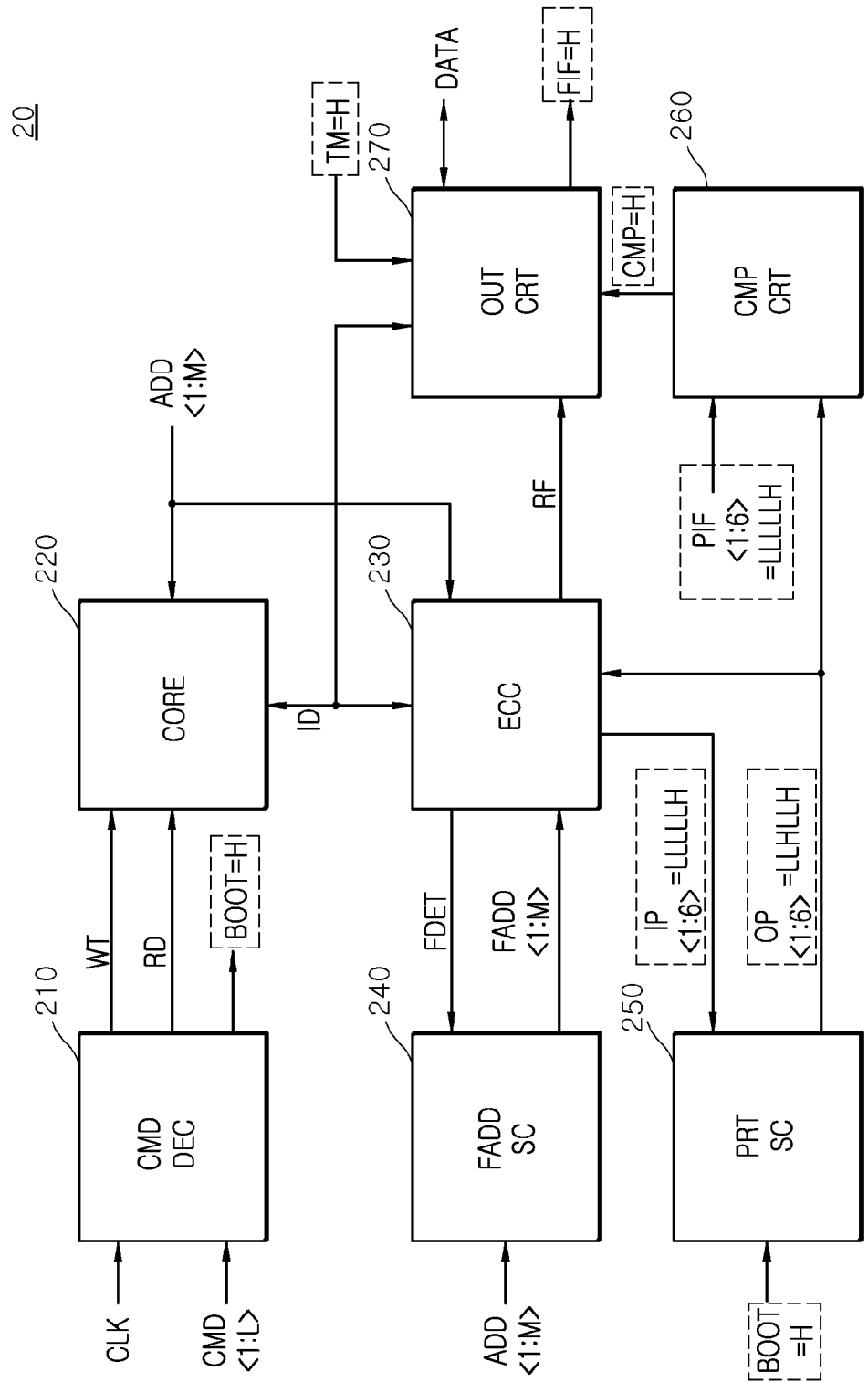

An operation of detecting whether an error has occurred in a parity in the test mode in the semiconductor system 1 according to an embodiment of the present disclosure is described as follows with reference to FIGS. 8 and 9.

First, an operation of an error not occurring in a parity in the test mode in the semiconductor system 1 according to an embodiment of the present disclosure is described as follows with reference to FIG. 8.

The command decoder 210 may generate the bootup signal BOOT that is enabled to the logic high level H when the first to L-th commands CMD<1:L> input in synchronization with the clock CLK have a logic level combination for a bootup operation.

The parity storage circuit 250 may have its multiple fuses programmed and store, in the multiple fuses, the first to sixth internal parities IP<1:6> having "L, L, L, L, L, H" in the normal mode. The parity storage circuit 250 may output, as the first to sixth output parities OP<1:6> having "L, L, L, L, L, H", the first to sixth internal parities IP<1:6> that are stored when the bootup signal BOOT having the logic high level H is input in the test mode.

The comparison circuit 260 may generate the comparison signal CMP having the logic low level L by comparing the first to sixth output parities OP<1:6> having "L, L, L, L, L, H" and the first to sixth parity information PIF<1:6> having "L, L, L, L, L, H" in the test mode.

The output circuit 270 may output the comparison signal CMP having the logic low level L as the failure information FIF when the test mode signal TM enabled to the logic high level H in the test mode is input.

The controller 10 may detect that an error is not present in the first to sixth internal parities IP<1:6> and the first to sixth output parities OP<1:6> by receiving the failure information FIF having the logic low level L.

Next, an operation of an error occurring in a parity in the test mode in the semiconductor system 1 according to an embodiment of the present disclosure is described as follows with reference to FIG. 9.

The command decoder 210 may generate the bootup signal BOOT that is enabled to the logic high level H when the first to L-th commands CMD<1:L> input in synchronization with the clock CLK have a logic level combination for a bootup operation.

The parity storage circuit 250 may have its multiple fuses programmed and store, in the multiple fuses, the first to sixth internal parities IP<1:6> having "L, L, L, L, L, H" in the normal mode. The parity storage circuit 250 may output, as the first to sixth output parities OP<1:6> having "L, L, H, L, L, H", the first to sixth internal parities IP<1:6> that are stored when the bootup signal BOOT having the logic high level H is input in the test mode. At this time, the third output parity OP<3> may be generated as the logic high level H without being output as the logic low level L because an error occurs in the third output parity OP<3>.

The comparison circuit 260 may generate the comparison signal CMP having the logic high level H by comparing the first to sixth output parities OP<1:6> having "L, L, H, L, L, H" and the first to sixth parity information PIF<1:M> having "L, L, L, L, L, H" in the test mode.

The output circuit 270 may output the comparison signal CMP having the logic high level H as the failure information FIF when the test mode signal TM enabled to the logic high level H in the test mode is input.

The controller 10 may detect that an error has occurred in the first to sixth internal parities IP<1:6> and the first to sixth output parities OP<1:6> by receiving the failure information FIF having the logic high level H.

Such a semiconductor system 1 according to an embodiment of the present disclosure may detect an error occurred in a parity by storing, in a fuse circuit, the first to M-th internal parities IP<1:M> generated by ECC-encoding the first to M-th addresses ADD<1:M> and detecting a result of a comparison between the first to M-th parity information PIF<1:M>, that is, expected values including error information with regard to the first to M-th addresses ADD<1:M>, and the first to M-th output parities OP<1:M> generated from the first to M-th internal parities IP<1:M> that are stored in the fuse circuit in the test mode.

Figure 10:
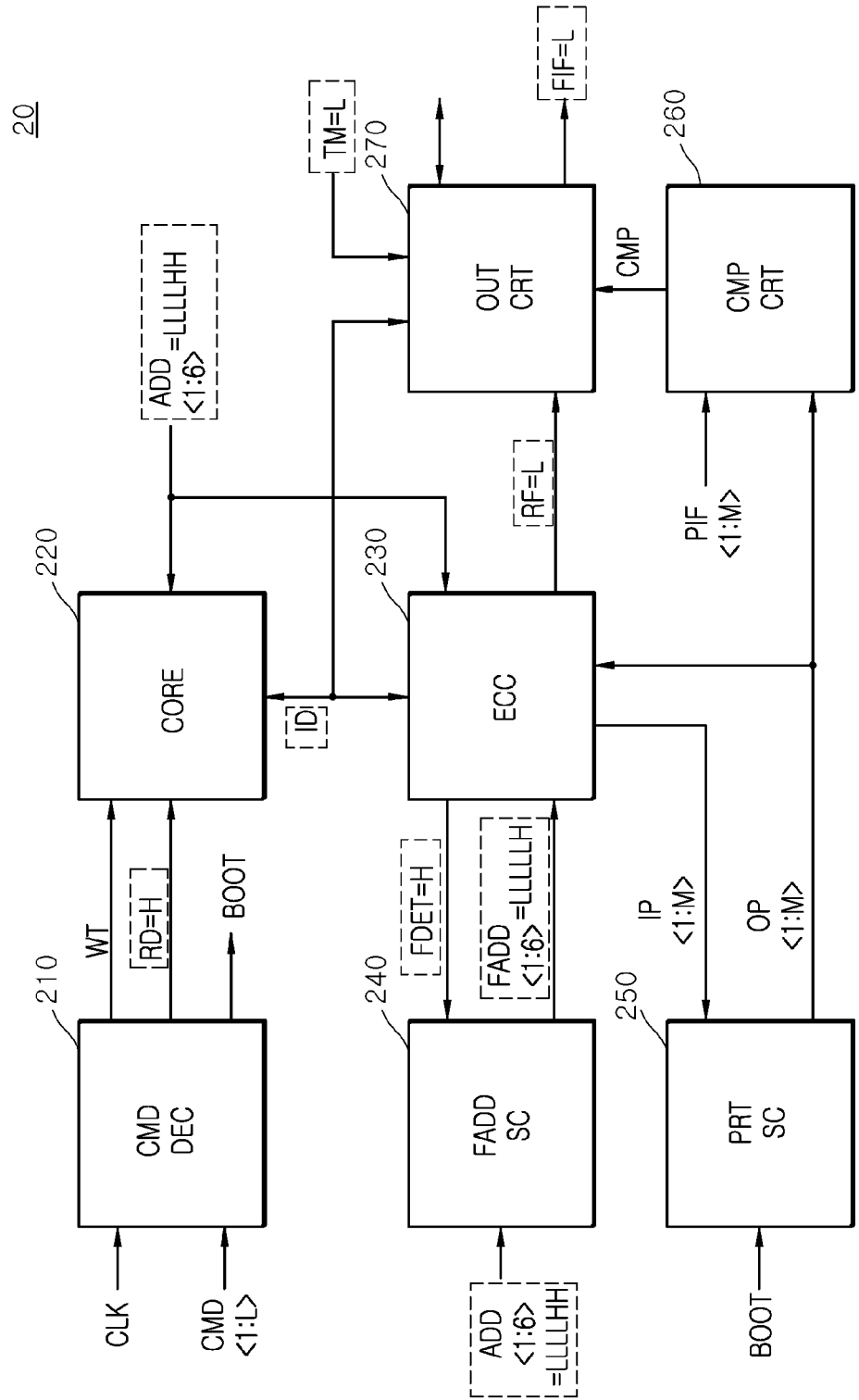

An operation of detecting whether a repair has been performed on an address in the normal mode in the semiconductor system 1 according to an embodiment of the present disclosure is described as follows with reference to FIGS. 10 and 11.

First, an operation of a repair being performed on an address in the normal mode in the semiconductor system 1 according to an embodiment of the present disclosure is described as follows with reference to FIG. 10.

The command decoder 210 may generate the read signal RD that is enabled to the logic high level H when the first to L-th commands CMD<1:L> input in synchronization with the clock CLK have a logic level combination for a first read operation.

The core circuit 220 may output the internal data ID that is stored at a location selected by the first to sixth addresses ADD<1:6> having "L, L, L, L, H, and H", when the read signal RD having the logic high level H and for performing a read operation is input.

The error correction circuit 230 may correct an error included in the internal data ID. The error correction circuit 230 may generate the failure detection signal FDET when the error is included in the internal data ID output by the core circuit 220 based on the first to sixth addresses ADD<1:6>.

The failure address storage circuit 240 may store the first to sixth addresses ADD<1:6> having "L, L, L, L, H, and H" when the failure detection signal FDET having the logic high level H is input.

The command decoder 210 may generate the read signal RD that is enabled to the logic high level H when the first to L-th commands CMD<1:L> input in synchronization with the clock CLK have a logic level combination for a second read operation.

The core circuit 220 may output the internal data ID that is stored at the location selected by the first to sixth addresses ADD<1:6> having "L, L, L, L, H, and H" when the read signal RD having the logic high level H and for performing a read operation is input.

The error correction circuit 230 may correct an error included in the internal data ID. The error correction circuit 230 may generate the failure detection signal FDET when the error is included in the internal data ID output by the core circuit 220 based on the first to sixth addresses ADD<1:6>.

The failure address storage circuit 240 may output the first to sixth failure addresses FADD<1:6> having "L, L, L, L, L, H." At this time, the fifth failure address FADD<5> may be generated as the logic low level L without being output as the logic high level H because an error has occurred in the fifth failure address FADD<5>.

The error correction circuit 230 may correct the error by inverting the logic level of the fifth failure address FADD<5> that is included in the first to sixth failure addresses FADD<1:6> having "L, L, L, L, L, H", and may generate the repair flag signal RF having the logic low level L by comparing the first to sixth repair addresses RADD<1:6> that have "L, L, L, L, H, and H" and an error of which has been corrected and the first to sixth addresses ADD<1:6> having "L, L, L, L, H, and H."

The output circuit 270 may output the repair flag signal RF having the logic low level L as the failure information FIF when the test mode signal TM that is disabled to the logic low level L in the normal mode is input.

The controller 10 may detect that a repair has been performed on the first to sixth addresses ADD<1:6> by receiving the failure information FIF having the logic low level L.

Next, an operation of a repair being not performed on an address in the normal mode in the semiconductor system 1 according to an embodiment of the present disclosure is described as follows with reference to FIG. 11.

Figure 11:
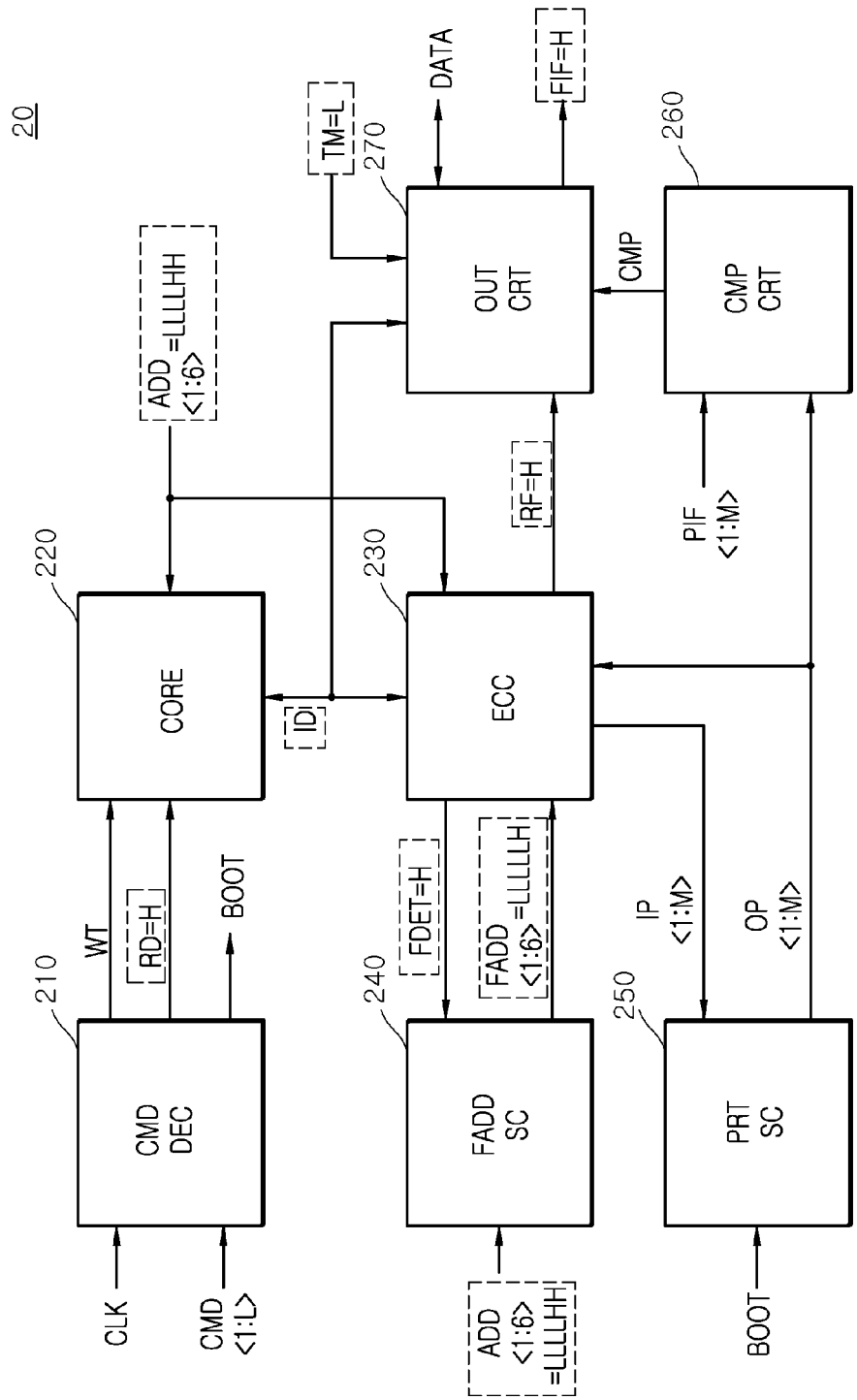

Referring to FIG. 11, the command decoder 210 may generate the read signal RD that is enabled to the logic high level H when the first to L-th commands CMD<1:L> input in synchronization with the clock CLK have a logic level combination for a first read operation.

The core circuit 220 may output the internal data ID that is stored at a location selected by the first to sixth addresses ADD<1:6> having "L, L, L, L, H, and H" when the read signal RD having the logic high level H and for performing a read operation is input.

The error correction circuit 230 may correct an error included in the internal data ID. The error correction circuit 230 may generate the failure detection signal FDET when an error is included in the internal data ID output by the core circuit 220 based on the first to sixth addresses ADD<1:6>.

The failure address storage circuit 240 may store the first to sixth addresses ADD<1:6> having "L, L, L, L, H, and H" when the failure detection signal FDET having the logic high level H is input.

The command decoder 210 may generate the read signal RD that is enabled to the logic high level H when the first to L-th commands CMD<1:L> input in synchronization with the clock CLK have a logic level combination for a second read operation.

The core circuit 220 may output the internal data ID that is stored at the location selected by the first to sixth addresses ADD<1:6> having "L, L, L, L, H, and H" when the read signal RD having the logic high level H and for performing a read operation is input.

The error correction circuit 230 may correct an error included in the internal data ID. The error correction circuit 230 may generate the failure detection signal FDET when the error is included in the internal data ID output by the core circuit 220 based on the first to sixth addresses ADD<1:6>.

The failure address storage circuit 240 may output the first to sixth failure addresses FADD<1:6> having "L, L, L, L, L, H". At this time, the fifth failure address FADD<5> may be generated as the logic low level L without being output as the logic high level H because an error has occurred in the fifth failure address FADD<5>.

The error correction circuit 230 might not invert the logic level of the fifth failure address FADD<5> that is included in the first to sixth failure addresses FADD<1:6> having "L, L, L, L, L, H", and may generate the repair flag signal RF having the logic high level H by comparing the first to sixth repair addresses RADD<1:6> having "L, L, L, L, L, H" and the first to sixth addresses ADD<1:6> having "L, L, L, L, H, and H."

The output circuit 270 may output the repair flag signal RF having the logic high level H as the failure information FIF when the test mode signal TM that is disabled to the logic low level L in the normal mode is input.

The controller 10 may detect that a repair has not been performed on the first to sixth addresses ADD<1:6> by receiving the failure information FIF having the logic high level H.

Such a semiconductor system 1 according to an embodiment of the present disclosure may detect whether a repair has been performed on the first to M-th addresses ADD<1:

M> by storing, in a fuse circuit, the first to M-th addresses ADD<1:M> of a location at which a failure has occurred, and detecting a result of a comparison between the input first to M-th addresses ADD<1:M> and the first to M-th repair addresses RAFF<1:M> generated by repairing the first to M-th addresses ADD<1:M> that are stored in the fuse circuit in the normal mode.

Figure 12:
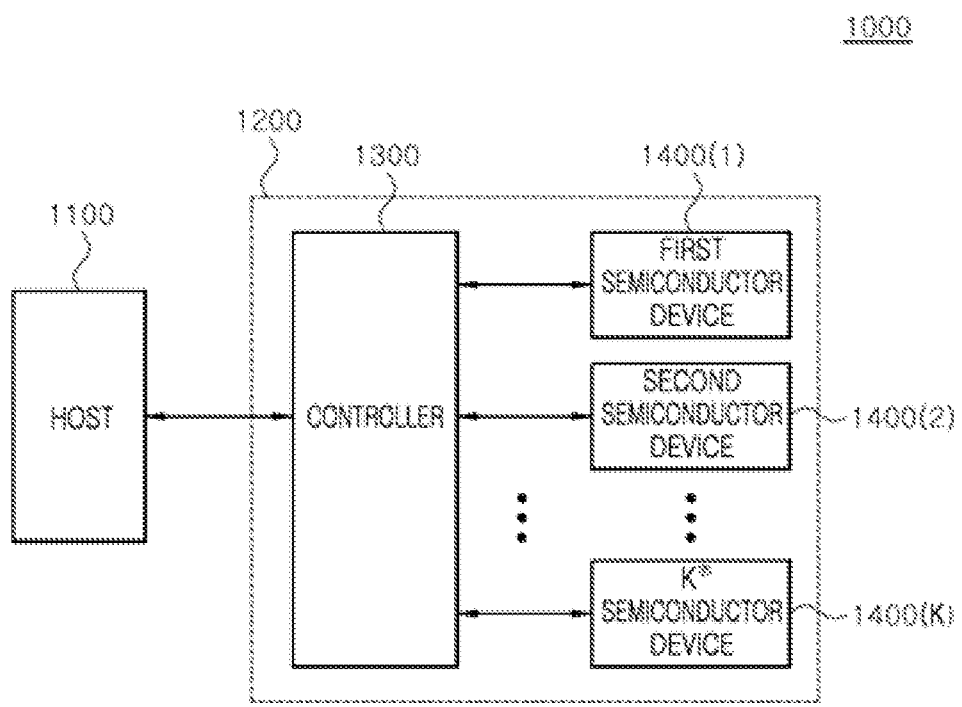
FIG. 12 is a diagram illustrating a configuration according to an embodiment of an electronic system to which the semiconductor system illustrated in FIGS. 1 to 11 is applied.

FIG. 12 is a block diagram illustrating a configuration of an electronic system 1000 according to an embodiment of the present disclosure. As illustrated in FIG. 12, the electronic system 1000 may include a host 1100 and a semiconductor system 1200.

The host 1100 and the semiconductor system 1200 may mutually transmit and receive signals by using an interface protocol. Examples of the interface protocol that is used between the host 1100 and the semiconductor system 1200 may include a multi-media card (MMC), an enhanced small disk interface (ESDI), integrated drive electronics (IDE), peripheral component interconnect-express (PCI-E), advanced technology attachment (AAA), serial ATA (SATA), parallel ATA (PATA), a serial attached SCSI (SAS), a universal serial bus (USB), etc.

The semiconductor system 1200 may include a controller 1300 and semiconductor devices 1400(K:1). The controller 1300 may control the semiconductor devices 1400(K:1) so that the semiconductor devices 1400(K:1) perform the test mode and the normal mode. Each of the semiconductor devices 1400(K:1) may store, in a fuse circuit, a parity that is generated by ECC-encoding an address, and may output, to the controller 1300, a result of a comparison between an expected value including error information with regard to the address and the parity that is stored in the fuse circuit in the test mode. The controller 1300 may detect an error having occurred in the parity by receiving, from each of the semiconductor devices 1400(K:1), the result of the comparison between the expected value including the error information with regard to the address and the parity that is stored in the fuse circuit. Each of the semiconductor devices 1400(K:1) may store, in a fuse circuit, an address at a location at which a failure occurred, and may output, to the controller 1300, a result of a comparison between an input address and a repair address generated by repairing the address that is stored in the fuse circuit in the normal mode. The controller 1300 may detect whether a repair has been performed on the address by receiving the result of the comparison between the address and the repair address generated by repairing the address that is stored in the fuse circuit.

The controller 1300 may be implemented as the controller 10 illustrated in FIG. 1. Each of the semiconductor devices 1400(K:1) may be implemented as the semiconductor device 20 illustrated in FIGS. 1 and 2. According to an embodiment, each of the semiconductor devices 1400(K:1) may be implemented using one of dynamic random access memory (DRAM), phase change random access memory (PRAM), resistive random access memory (RRAM), magnetic random access memory (MRAM), and ferroelectric random access memory (FRAM).

What is claimed is:

1. A semiconductor system comprising:
a controller configured to:
output parity information comprising an expected value at which an error correction code (ECC) encoding operation has been performed on an address in a test mode of a semiconductor device; and
receive failure information; and
the semiconductor device configured to:
store an internal parity generated by performing the ECC encoding operation on the address that is input in a normal mode of the semiconductor device; and
output the failure information generated by comparing the parity information and an output parity generated from the internal parity that is stored in the semiconductor device in the test mode, and
wherein the semiconductor device comprises:
an error correction circuit configured to generate the internal parity by performing the ECC encoding operation on the address when an error occurs in internal data output by the address in the normal mode;
a parity storage circuit configured to store the internal parity in the normal mode and to output, as the output parity, the internal parity that is stored in the semiconductor device after a start of a bootup operation in the test mode;
a comparison circuit configured to generate a comparison signal by comparing the output parity and the parity information; and
an output circuit configured to output the comparison signal as the failure information when a test mode signal is enabled.

2. The semiconductor system of claim 1, wherein:
the controller is configured to output the address and the parity information to the semiconductor device through a first transmission line, and
the semiconductor device is configured to output the failure information to the controller through a second transmission line.

3. The semiconductor system of claim 1, wherein the controller is configured to detect whether an error has occurred in the internal parity and the output parity by receiving the failure information.

4. The semiconductor system of claim 1, wherein the semiconductor device is configured to output, as the output parity, the internal parity that is stored in the semiconductor device after a start of the bootup operation.

5. The semiconductor system of claim 1, wherein the error correction circuit comprises:
a detection circuit configured to generate a failure detection signal by detecting the error in the internal data; and
a parity generation circuit configured to generate the internal parity by performing the ECC encoding operation on the address when the failure detection signal is enabled.

6. A semiconductor system comprising:
a controller configured to:
output a command and an address;
input and output data;
output parity information comprising an expected value at which an error correction code (ECC) encoding operation has been performed on the address in a test mode; and
receive failure information; and
a semiconductor device configured to:
output, as the failure information, a repair flag signal generated by comparing the address and a repaired repair address in a normal mode based on the command and the address;
store an internal parity generated by performing the ECC encoding operation on the address when an error occurs in internal data output by the address; and output, as the failure information, a comparison signal generated by comparing the parity information and an output parity generated from the internal parity in the test mode.

7. The semiconductor system of claim 6, wherein:
the controller is configured to output the address and the parity information to the semiconductor device through a first transmission line, and
the semiconductor device is configured to output the data and the failure information to the controller through a second transmission line.

8. The semiconductor system of claim 6, wherein the controller is configured to detect whether an error has occurred in the internal parity and the output parity by receiving the failure information in the test mode.

9. The semiconductor system of claim 6, wherein the controller is configured to detect whether a repair has been performed on the address by receiving the failure information in the normal mode.

10. The semiconductor system of claim 6, wherein the semiconductor device is configured to output, as the output parity, the internal parity that is stored in the semiconductor device after a start of a bootup operation based on the command.

11. The semiconductor system of claim 6, wherein the semiconductor device comprises:
an error correction circuit configured to generate a failure detection signal when an error occurs in the internal data output by the address in the normal mode, generate the internal parity by performing the ECC encoding operation on the address, and generate the repair flag signal comprising information with regard to whether a repair has been performed on the address;
a failure address storage circuit configured to store the address as a failure address when the failure detection signal is enabled;
a parity storage circuit configured to store the internal parity in the normal mode, output, as the output parity, the internal parity that is stored in the parity storage circuit, and output, as the output parity, the internal parity that is stored in the parity storage circuit after a start of a bootup operation in the test mode;
a comparison circuit configured to generate a comparison signal by comparing the output parity and the parity information; and
an output circuit configured to output, as the failure information, any one of the repair flag signal and the comparison signal by a test mode signal.

12. The semiconductor system of claim 11, wherein the error correction circuit comprises:
a detection circuit configured to generate the failure detection signal by detecting the error in the internal data;
a parity generation circuit configured to generate the internal parity by performing the ECC encoding operation on the address when the failure detection signal is enabled and generate the internal parity by performing the ECC encoding operation on the failure address;
a syndrome generation circuit configured to generate a syndrome by ECC-decoding the internal parity and the output parity;
a correction circuit configured to generate a repair address by correcting an error included in the failure address based on the syndrome; and
an address comparison circuit configured to generate the repair flag signal by comparing the repair address and the address.

13. The semiconductor system of claim 11, wherein the output circuit comprises:
a data input/output circuit configured to output the data as the internal data after a start of a write operation in the normal mode and output the internal data as the data after a start of a read operation in the normal mode; and
a failure information output circuit configured to output any one of the repair flag signal and the comparison signal as the failure information by the test mode signal.

14. A semiconductor device comprising:
an error correction circuit configured to:
generate a failure detection signal when an error occurs in internal data in a normal mode;
generate an internal parity by performing an error correction code (ECC) encoding operation on an address; and
generate a repair flag signal by comparing the address and a repair address that is generated by correcting an error included in a failure address;
a parity storage circuit configured to:
store the internal parity in the normal mode;
output, as an output parity, the internal parity that is stored in the parity storage circuit; and
output, as the output parity, the internal parity that is stored in the parity storage circuit in a test mode; and
a comparison circuit configured to generate a comparison signal by comparing the output parity and parity information comprising an expected value at which the ECC encoding operation has been performed on the address in the test mode.

15. The semiconductor device of claim 14, wherein:
the repair flag signal is set as a signal that is enabled when a repair operation of correcting the error included in the failure address is not performed, and
the comparison signal is set as a signal that is enabled when an error occurs in the internal parity and the output parity.

16. The semiconductor device of claim 14, wherein the error correction circuit comprises:
a detection circuit configured to generate the failure detection signal by detecting the error in the internal data;
a parity generation circuit configured to generate the internal parity by performing the ECC encoding operation on the address when the failure detection signal is enabled and generate the internal parity by performing the ECC encoding operation on the failure address;
a syndrome generation circuit configured to generate a syndrome by ECC-decoding the internal parity and the output parity;
a correction circuit configured to generate the repair address by correcting the error included in the failure address based on the syndrome; and
an address comparison circuit configured to generate the repair flag signal by comparing the repair address and the address.

17. The semiconductor device of claim 14, wherein:
the parity storage circuit is implemented as multiple fuses, and
the multiple fuses are programmed and are configured to store the internal parity.

18. The semiconductor device of claim 14, further comprising:
a core circuit configured to output the internal data that is stored in an area selected by the address in the normal mode; and a failure address storage circuit configured to store the address when the failure detection signal is enabled and output, as the failure address, the address that is stored in the failure address storage circuit.

19. The semiconductor device of claim 18, wherein:
the failure address storage circuit is implemented as multiple fuses, and
the multiple fuses are programmed and are configured to store the address.

* * * * *